(12) United States Patent
Ilkov et al.

(10) Patent No.: US 9,588,171 B2
(45) Date of Patent: Mar. 7, 2017

(54) SYSTEM AND METHOD FOR TESTING AN INTEGRATED CIRCUIT

(75) Inventors: Nikolay Ilkov, Munich (DE); Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1299 days.

(21) Appl. No.: 13/472,666

(22) Filed: May 16, 2012

(65) Prior Publication Data
US 2013/0307576 A1    Nov. 21, 2013

(51) Int. Cl.
 G01R 31/02    (2006.01)
 G01R 31/26    (2014.01)
 G01R 31/28    (2006.01)

(52) U.S. Cl.
 CPC ..... *G01R 31/2621* (2013.01); *G01R 31/2822* (2013.01)

(58) Field of Classification Search
 CPC .. G01R 31/2822; G01R 31/362; G01K 7/015; H01L 27/1089; G01N 27/026; G01N 33/66
 USPC ...... 324/500, 600, 762.02, 764.01, 415–433, 324/522, 713, 76.11, 76.39; 327/564
 See application file for complete search history.

(56) References Cited

U.S. PATENT DOCUMENTS

| 5,694,063 | A | 12/1997 | Burlison et al. |
| 6,664,798 | B2 | 12/2003 | De Jong et al. |
| 7,705,600 | B1 | 4/2010 | Byrkett |
| 8,278,952 | B2 | 10/2012 | Tseng et al. |
| 2002/0053943 | A1 | 5/2002 | Yamasaki et al. |
| 2004/0095111 | A1* | 5/2004 | Kernahan ............. H02M 3/157 323/282 |
| 2004/0095112 | A1 | 5/2004 | Kernahan et al. |
| 2004/0222810 | A1 | 11/2004 | Frankowsky et al. |
| 2009/0167094 | A1 | 7/2009 | Tseng et al. |
| 2010/0164607 | A1* | 7/2010 | Miyatake ................. G05F 3/205 327/537 |
| 2011/0105055 | A1 | 5/2011 | Ilkov |
| 2011/0109489 | A1* | 5/2011 | Henzler ................. H03M 1/125 341/143 |
| 2011/0254521 | A1* | 10/2011 | Iacob ...................... G05F 1/575 323/282 |

(Continued)

FOREIGN PATENT DOCUMENTS

CN    2078447 U    6/1991
CN    1208235 A    2/1999

(Continued)

OTHER PUBLICATIONS

Infineon Technologies, AG, "BGSF18DM20 SP8T Antenna Switch Mode with Integrated SPI controller, 2 GSM-Tx and 6 WCDMA-TRx Ports for 2G/3G Convergence" Data Sheet, RF & Protection Devices, Mar. 7, 2011, pp. 17.

*Primary Examiner* — Melissa Koval
*Assistant Examiner* — Trung Nguyen
(74) *Attorney, Agent, or Firm* — Slater Matsil, LLP

(57) ABSTRACT

In accordance with an embodiment, a method of testing an integrated circuit, includes receiving a supply voltage on the integrated circuit via a first input pin, providing power to circuits disposed on the integrated circuit via the first input pin, comparing the supply voltage to an internally generated voltage, generating a digital output value based on the comparing, and applying the digital output value to a pin of the integrated circuit.

36 Claims, 8 Drawing Sheets

(56) References Cited

U.S. PATENT DOCUMENTS

| | | | |
|---|---|---|---|
| 2011/0260746 A1 | 10/2011 | Huang et al. | |
| 2013/0093505 A1* | 4/2013 | Gupta | G05F 1/575 |
| | | | 327/540 |
| 2013/0154761 A1 | 6/2013 | Ilkov | |

FOREIGN PATENT DOCUMENTS

| | | |
|---|---|---|
| CN | 1523368 A | 8/2004 |
| CN | 102289239 A | 12/2011 |
| JP | 5107262 B2 | 12/2012 |
| KR | 20010039359 A | 5/2001 |
| KR | 1020020008158 | 1/2002 |
| KR | 20050070131 A | 7/2005 |
| TW | 200928654 A | 7/2009 |

\* cited by examiner

SYSTEM AND METHOD FOR TESTING AN INTEGRATED CIRCUIT

TECHNICAL FIELD

This invention relates generally to electronic circuits and methods, and more particularly to a system and method for testing an integrated circuit.

BACKGROUND

The increasing number of frequency bands and standards in mobile communication systems increases the design complexity of mobile phones, as some mobile phones are now configured to operate using multiple standards across multiple frequency bands. In addition, the mobile phone may also include a Global Positioning System (GPS) receiver. In many mobile phones, these multiple frequency bands and standards are implemented by using multiple radio frequency (RF) transmitters and receivers within multiple signal paths that may be coupled to a single antenna using an antenna switch. The introduction of more and more frequency bands within the mobile phone, however, may cause some issues with respect to jamming due to the creation of distortion products within circuitry of the mobile phone and within the antenna switch itself.

In some cases, these antenna switches may be implemented using one or MOS switching transistors disposed on an integrated circuit substrate. In order to minimize distortion products, the substrates of the MOS switching transistors may be biased to a negative voltage and/or the gate driving voltage may be driven above a locally available supply voltage using one or more voltage boosting circuits, such as a charge pump circuit. According to common practice, antenna switches are tested to ensure functionality and performance. One way to test an RF switch is to verify its gross functionality at DC. Such a test, however, may not detect defects in the switching transistor or the voltage boosting circuits that may degrade RF performance of the RF switch under normal operating conditions.

SUMMARY OF THE INVENTION

In accordance with an embodiment, a method of testing an integrated circuit, includes receiving a supply voltage on the integrated circuit via a first input pin, providing power to circuits disposed on the integrated circuit via the first input pin, comparing the supply voltage to an internally generated voltage, generating a digital output value based on the comparing, and applying the digital output value to a pin of the integrated circuit.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, testing an antenna switch. The invention may also be applied to the testability of other circuits and systems such as RF baseband switches and amplifiers.

Figure 1:
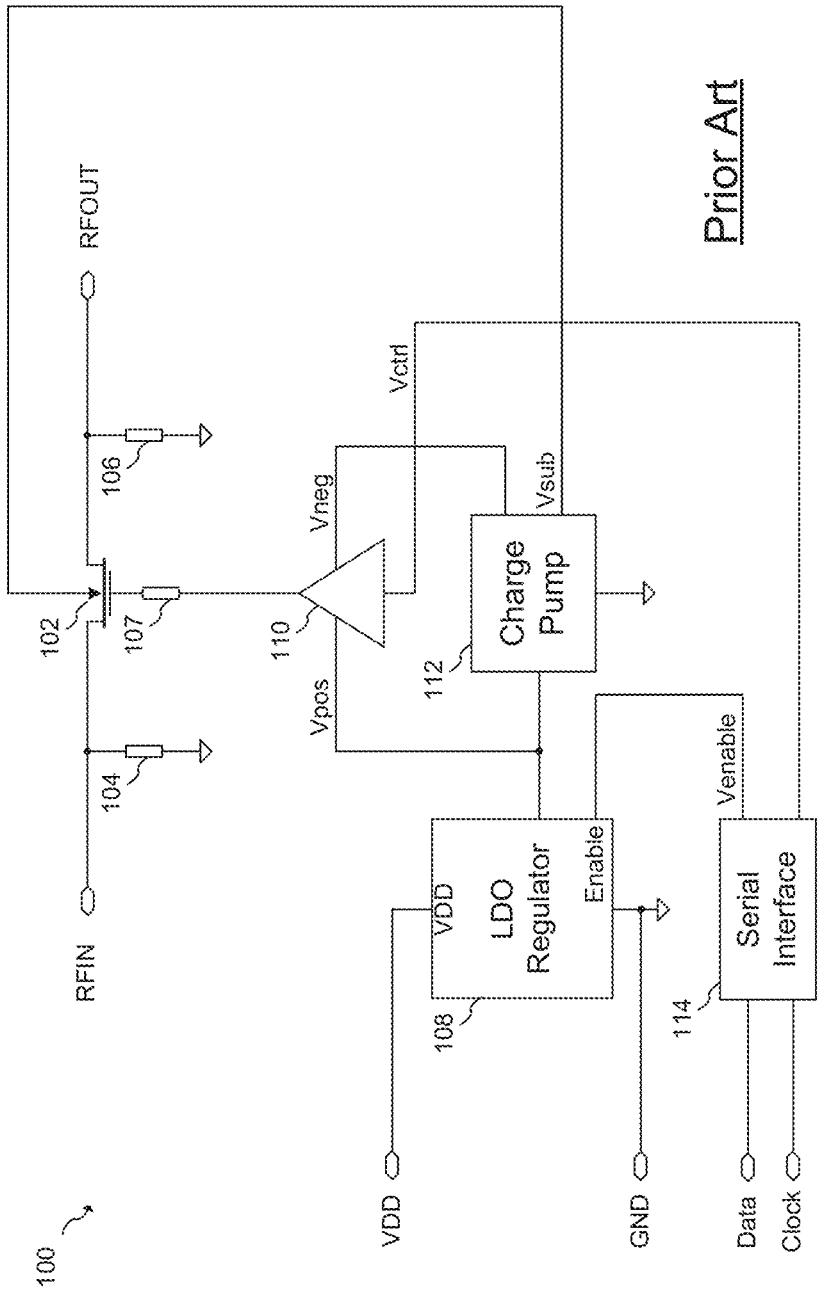
FIG. 1 illustrates a conventional RF switch circuit.

FIG. 1 illustrates a block diagram of a conventional CMOS RF switch 100. NMOS switching transistor 102 is coupled to input port RFIN and output port RFOUT. ESD resistors 104 and 106 are coupled to input port RFIN and output port RFOUT, respectively, to provide ESD protection. The gate of switching transistor 102 is driven by driver 110 via gate resistor 107. Gate resistor 107 may be used to ensure that the gate of switching transistor 102 is "floating" for frequencies above the 1/RC time constant of the resistance of gate resistor 107 and the gate-source and gate-drain capacitances of switching transistor 102. This high impedance seen by the gate at higher frequencies makes it possible to keep the transistor on and off at signal amplitudes that exceed the threshold voltage of transistor 102. Positive supply terminal Vpos of driver 110 is provided by low dropout (LDO) regulator 108 and negative supply terminal Vneg of driver 110 is provided by charge pump 112. Moreover, substrate voltage Vsub of switching transistor 102 may be biased to a negative voltage. Only one switching transistor 102 is shown for clarity of illustration, however, an antenna switch may have multiple switching transistors. For example, a typical RF switch may have between five and twelve RF inputs and between one three RF outputs depending on the particular system and its specifications. Other examples of RF switch systems and methods to which embodiment systems and methods may be applied are described in U.S. patent application Ser. No. 13/325,860 entitled "System and Method for a Radio Frequency Switch," filed on Dec. 11, 2011, which application is incorporated by reference herein in its entirety.

One way to enhance the harmonic performance of RF CMOS switches is to apply a gate-source voltage that is close to the maximum gate-source voltage that is safely allowable by the reliability criteria of the particular device. If this limit is exceeded, however, even a slightly increased gate voltage may cause over long-term device damage. On the other hand, if the gate-source voltage is too low, higher distortion may result during operation of the switch.

Because external supply voltages generally have a wide voltage tolerance, for example 10%, on-chip voltage regulators and charge pumps may be employed to produce control voltages. Furthermore, since chip area and pin-count is limited in many antenna switches used in high volume consumer goods, such as cellular telephones, no additional test pads are provided to test the performance of internal regulators and other internal control voltage generation circuits in many high volume parts. As such, indirect testing conventionally has been employed to test circuits, such as the circuit shown in FIG. 1. For example, one conventional method that may be used to test the LDO regulator voltage is measuring the supply current of the device and the insertion loss of RF switching transistor 102. In some circumstances, some margin, for example 0.4 V, may be needed to avoid exceeding the maximum allowed gate-source voltage of the switching device.

In an embodiment, on-chip comparators are used to measure parameters with respect to supply voltage and/or a voltage that is derived from a supply voltage. For example, in some embodiments, a comparator may have a reference input coupled to a divided supply voltage and a measurement input coupled to a voltage under test. During testing, the supply voltage may be precisely controlled using Kelvin connections on the supply pins during production test to control the supply voltage to a tight tolerance while measurements are being made. By making the output of the comparator available via a serial interface that is otherwise dedicated to the operation of the chip, testing of internal voltages and currents may be achieved without dedicated test pins on the integrated circuit.

In some embodiments, a go-no-go test may be performed by ramping the input reference voltage or supply voltage during the test so that a more exact parameter value may be obtained. Alternatively, a more complicated analog-to-digital converter may be used to achieve faster measurement times. The output of the comparator or the analog-to-digital converter may be connected to a data register coupled to an interface bus. Moreover, this interface bus may operate according to a known standard serial interfaces such as a serial peripheral interface (SPI), RF front-end mobile industry processor interface RFFE-Mipi, or other interface standards, as well as using nonstandard interfaces. Alternatively, the interface bus may be implemented with other types of digital interfaces, for example, a parallel interface.

Figure 2:
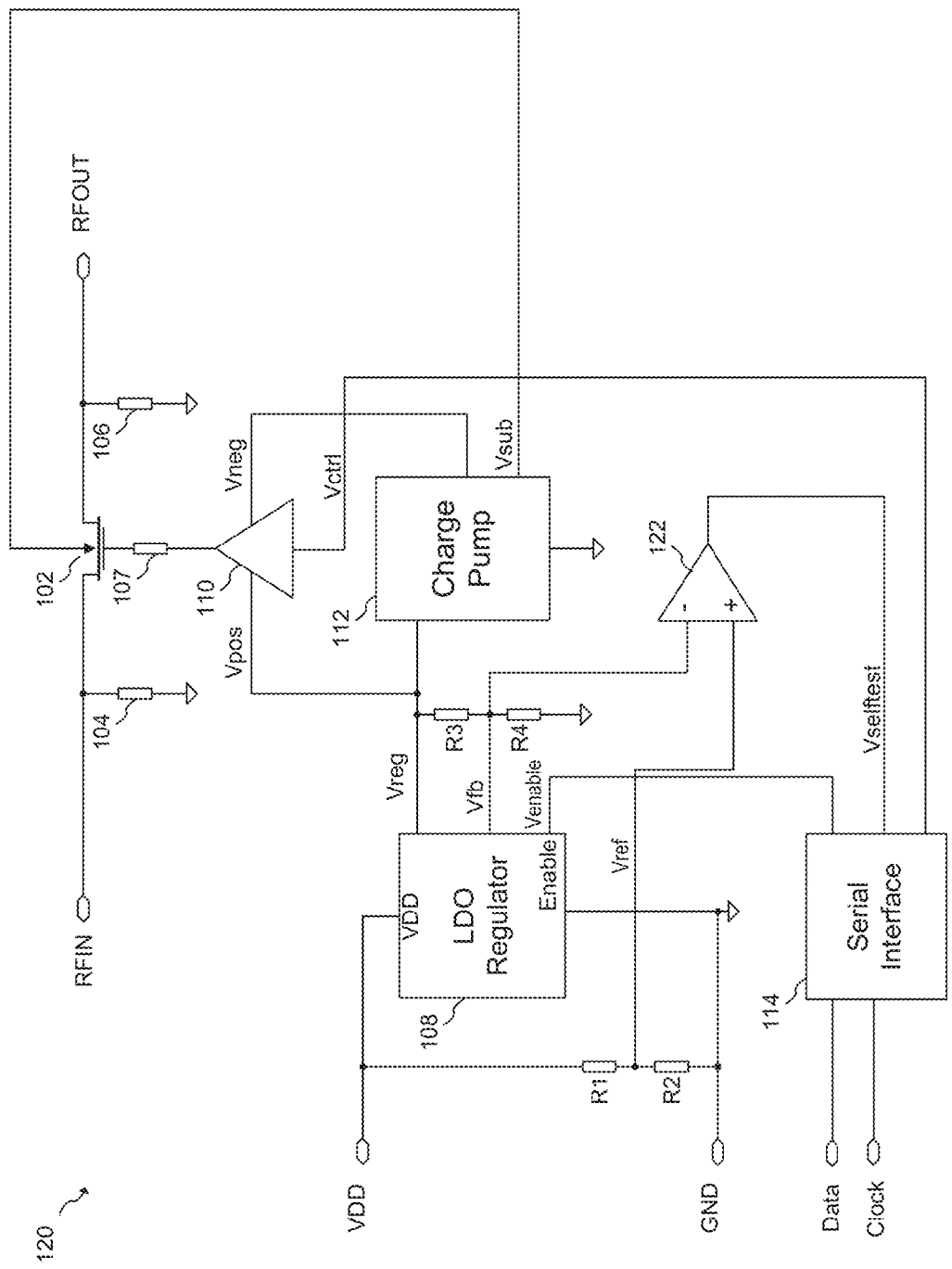
FIG. 2 illustrates an embodiment RF switch circuit configured to measure an output voltage of a voltage regulator.

FIG. 2 illustrates RF switch IC 120 according to an embodiment of the present invention. Similar to FIG. 1, RF switch IC 120 has switching transistor, 102, LDO regulator 108, serial interface 114, charge pump 112 and gate driver 110. IC 120 further has comparator 122, a first voltage divider made of resistors R1 and R2 is coupled between VDD and GND, and a second resistor divider made of resistors R3 and R4 is coupled between regulator output Vpos and ground. In an embodiment, the output of the second voltage divider provides feedback voltage Vfb to LDO regulator 108, and the output of the first voltage divider, Vref, may be used as a reference voltage for comparator 122. Alternatively, the output of LDO regulator 108 may be measured directly or via further voltage division circuit, and/or VDD may be used directly as a reference voltage. The output of comparator 122 is shown coupled to serial interface 114 via signal Vselftest. LDO regulator 108, charge pump 112, gate drive buffer 110, comparator 122 and serial interface 114 may be constructed using circuit design techniques known in the art and will not be detailed here. Furthermore, LDO regulator 108 may receive its power from a main chip power supply, a logic power supply, a dedicated power supply, or other type of power supply.

In an embodiment, LDO regulator 108 produces a regulated voltage at Vreg of about 1.5 V, which is used as the positive supply of gate driver 110 and as an input reference voltage for charge pump 112. Charge pump 112, in turn, generates substrate voltage Vsub of about −3 V and negative gate drive voltage Vneg of about −1.5 V. In some embodiments, the switching transistor 102 is fabricated in an isolated well that is coupled to voltage Vsub. This isolated well may be disposed within a semiconductor substrate. Supply voltage VDD may nominally be set between about 2.5 V and about 5 V in some embodiments. Alternatively, LDO regulator 108 and charge pump 112 may generate other voltages in other voltage ranges depending on the particular application and its specifications. The operating range for VDD may also have a different nominal operating range.

In an embodiment, LDO regulator 108 output voltage Vpos is measured by comparing feedback voltage Vfb divided supply voltage Vref. Voltage Vpos may be verified by applying a predetermined voltage at pin VDD and monitoring the output of comparator 122 via serial interface 114. In an embodiment, supply voltage VDD may be ramped in order to more precisely determine voltage Vpos as illustrated in FIGS. 3a and 3b.

It should be appreciated that the RF switch embodiment of FIG. 2 is just one example of a system that may be tested using embodiment systems and methods. In alternative embodiments of the present invention, other systems may be implemented. For example, in one embodiment, the output of LDO regulator 108 may be used to provide power to a main IC power supply, a logic power supply, or to other types of power supplies. In further embodiments, the output of LDO regulator 108 may be used to power one or more particular circuits.

Figure 3A:
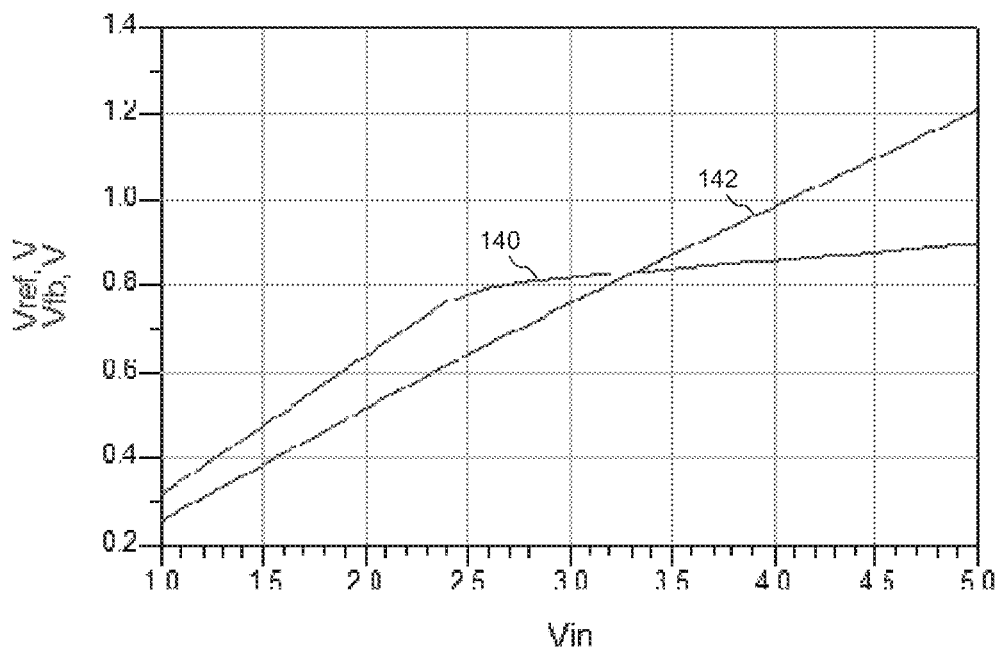
FIGS. 3a-b illustrate embodiment test waveforms for a voltage regulator test.
Figure 3B:
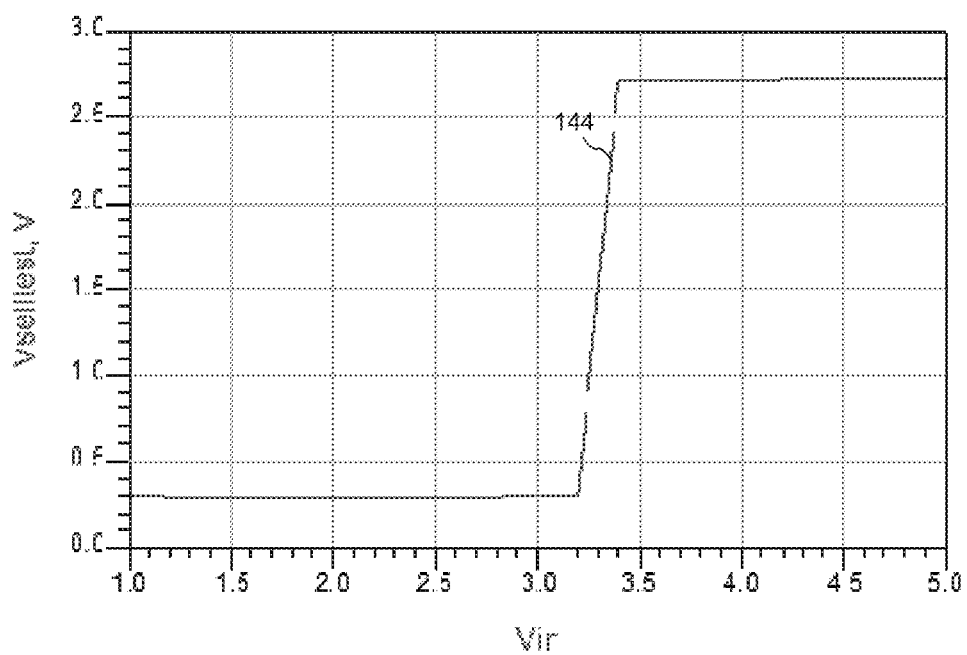

FIGS. 3a-b illustrate waveform diagrams that show the relationship between voltage regulator feedback voltage Vfb, divided supply voltage Vref, comparator 122 output voltage Vselftest, and the supply voltage, which is designated as Vin in FIGS. 3a-b. As Vin is increased from 1 V to 5 V, divided voltage Vref shows a corresponding increase from 0.24 V to 1.2 V. Feedback voltage Vfb increases linearly up for input voltages of up to about 2.3 V, and then starts to level out at about 0.8 V as LDO regulator 108 enters its compliance range. Comparator 122 output voltage Vselftest transitions from a logic low to a logic high at an input voltage of about 3.2 V, which approximately corresponds to the point at which Vref has a voltage that is about equal to Vfb. Alternatively, comparator 122 may operate in an active low mode and transition from logic high to logic low when Vref exceeds Vfb. The point at which this occurs is when Vpos=Vin*(R2*(R3+R4))/(R4*(R1+R2)), where R1, R2, R3 and R4 represent the resistance values of R1, R2, R3 and R4 of FIG. 2, and Vpos is the output voltage of LDO regulator 108 of FIG. 2.

In an embodiment, voltage divider resistors are scaled such that R1=3R2 and R3=R4. R1 to R4 may be implemented using polysilicon resistors having values between about 100 kΩ and about 1 MΩ. Alternatively, other resistor types, component values and/or ratios may be used depending on the particular application and its specifications. Furthermore, in some embodiments, comparator 122 includes hysteresis in order to reduce comparator chatter at when Vref is very close to Vfb. Such hysteresis may be implemented using a Schmitt trigger or other circuit techniques known in the art. In alternative embodiments of the present invention, resistors R1 to R4 may be further implemented using matched diodes, diode-connected CMOS transistors or other devices.

In an embodiment, serial interface 114 may control RF switching transistor 102 in order to reduce the number of interface pins. Serial interface 114 may also control other aspects of IC 120. For example serial interface may enable or disable LDO regulator 108 via signal Venable, and/or control the state of RF switching transistor 102 by activating gate driver 110 via control signal Vctrl.

In some embodiments the source and drain of switching transistor 102 is biased to ground via resistors 104 and 106, such that the system is operational without using DC blocking capacitors. Alternatively, DC blocking capacitors may be used in some embodiments. To further enhance the turn-off characteristics of RF switching transistor 102, charge pump 112 may be used to bias substrate voltage Vsub to a negative voltage.

Figure 4:
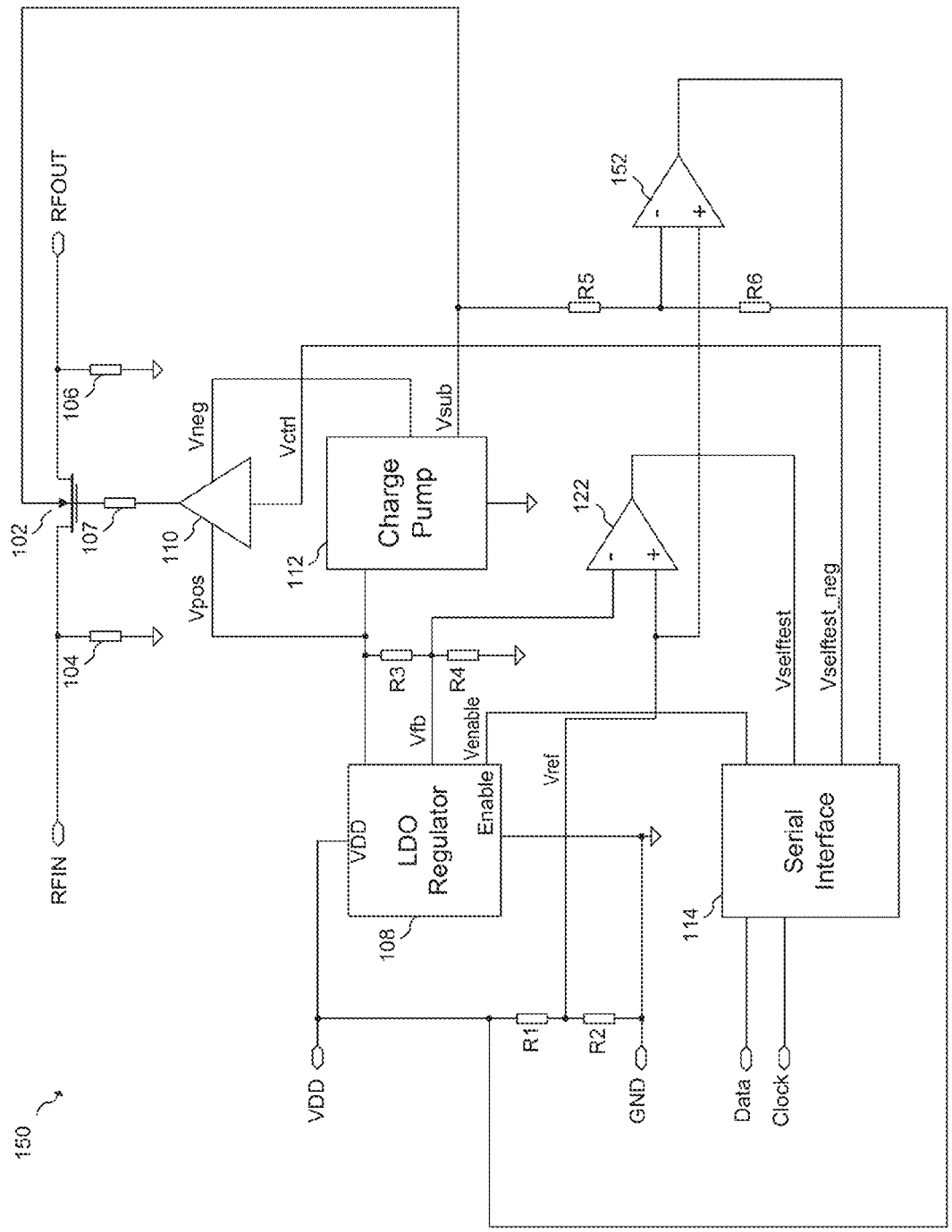
FIG. 4 illustrates an embodiment RF switch configured to perform a substrate voltage measurement.

FIG. 4 illustrates embodiment system 150 in which substrate voltage Vsub is further measured using comparator 152. In an embodiment, a further voltage divider made of resistors R5 and R6 is coupled between VDD and Vsub. The output voltage Vsub of charge pump 112 may be measured by varying VDD and monitoring the output of comparator 152. In a further embodiment, resistors R5 and R6 may also be coupled between regulated voltage Vpos and Vsub.

Figure 5:
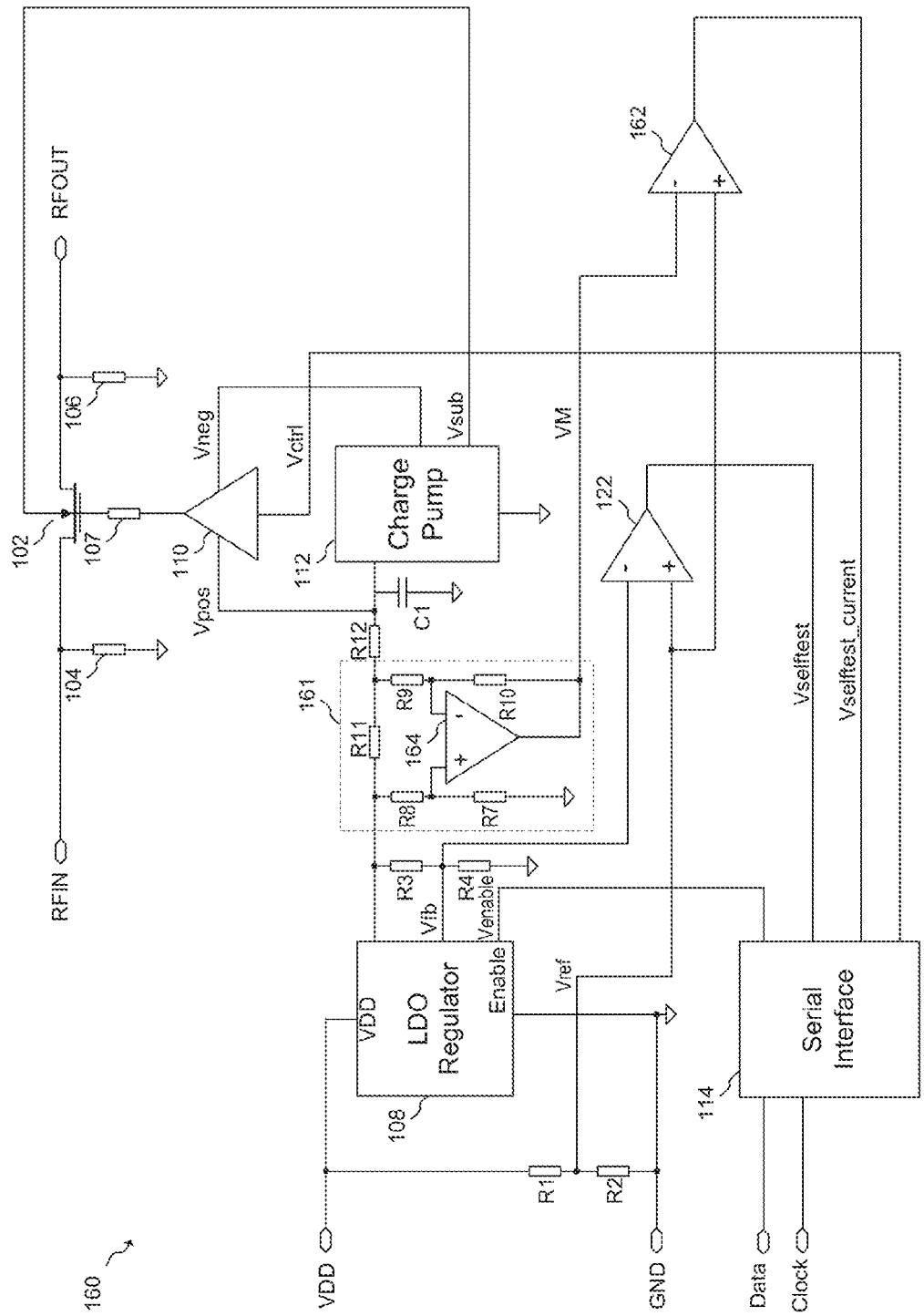
FIG. 5 illustrates an embodiment RF switch configured to perform a regulator output current measurement.

FIG. 5 illustrates embodiment system 160 in which the output current of LDO regulator 108 is measured using current measurement circuit 161 that includes amplifier 164 and resistors R7-R11, and comparator 162, the output of which is coupled to serial interface 114 via signal Vselftest_current. The current through resistor R11 may be converted to voltage VM, which is compared to Vref. In an embodiment, the current though R11 may be determined by sweeping VDD and monitoring the output of comparator 162 via serial interface 114. Resistor R12 and capacitor C1 may be provided to decouple the current measuring circuit from charge pump 112.

In some cases, slight gate damage (e.g. due to overvoltage) of the transistor may cause slightly increased leakage currents without immediately affecting the RF performance of the device. Such an increased leakage current may be caused by an initial device defect or by an ESD event that occurs after manufacturing, for example, during device handling. One way such a leakage may be detected is by measuring the substrate current leakage.

Figure 6:
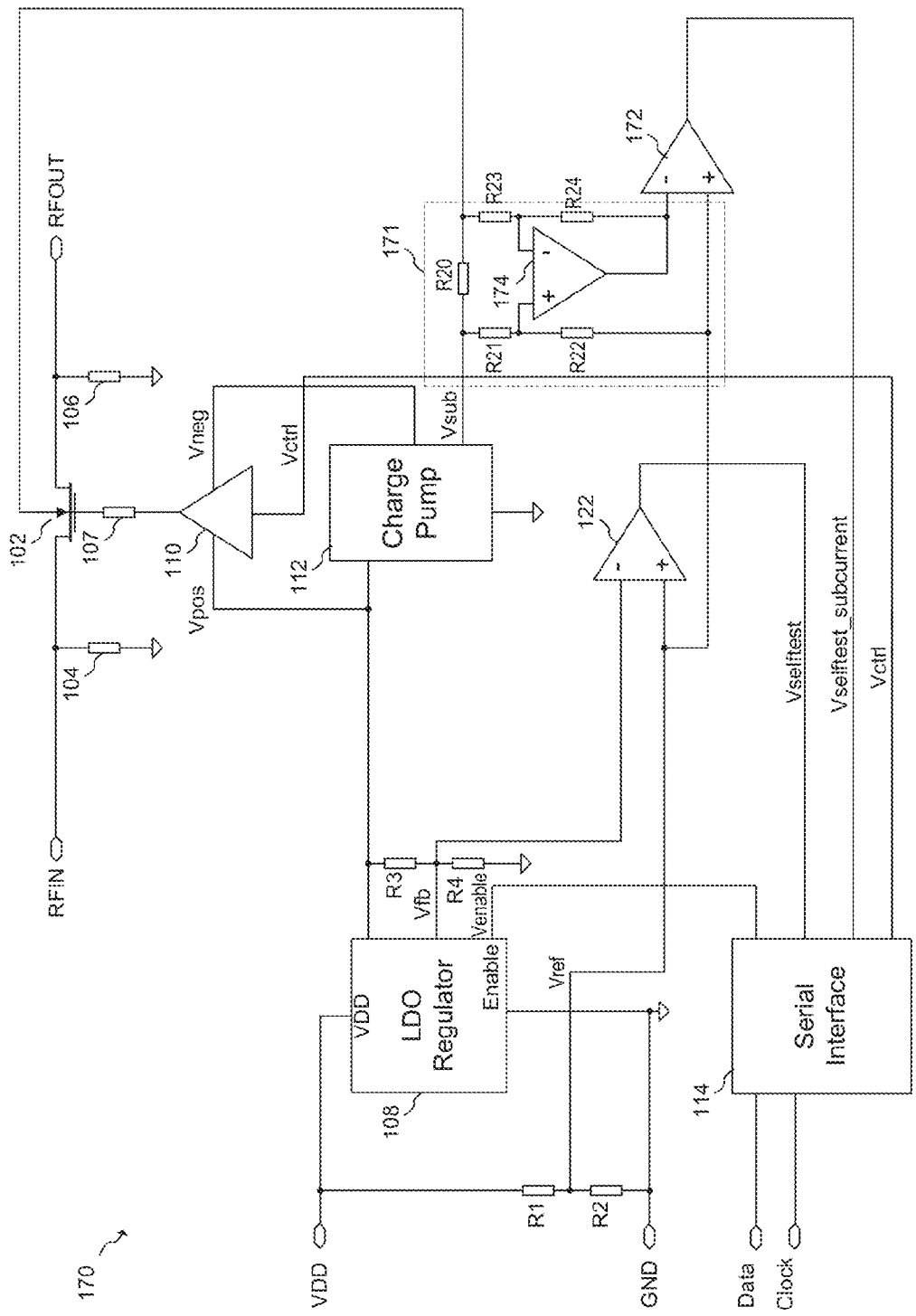
FIG. 6 illustrates an embodiment RF switch configured to perform a substrate current measurement.

FIG. 6 illustrates embodiment system 170 in which the substrate leakage current from charge pump output Vsub to the substrate connection of switching transistor 102 is measured using current measuring device 171 made of amplifier 174 and resistors R20-R24 and comparator 172, the output of which is coupled to serial interface 114 via signal Vselftest_subcurrent. In an embodiment, the substrate current is measured by sweeping VDD and monitoring the output of comparator 162 via serial interface 114.

Figure 7:
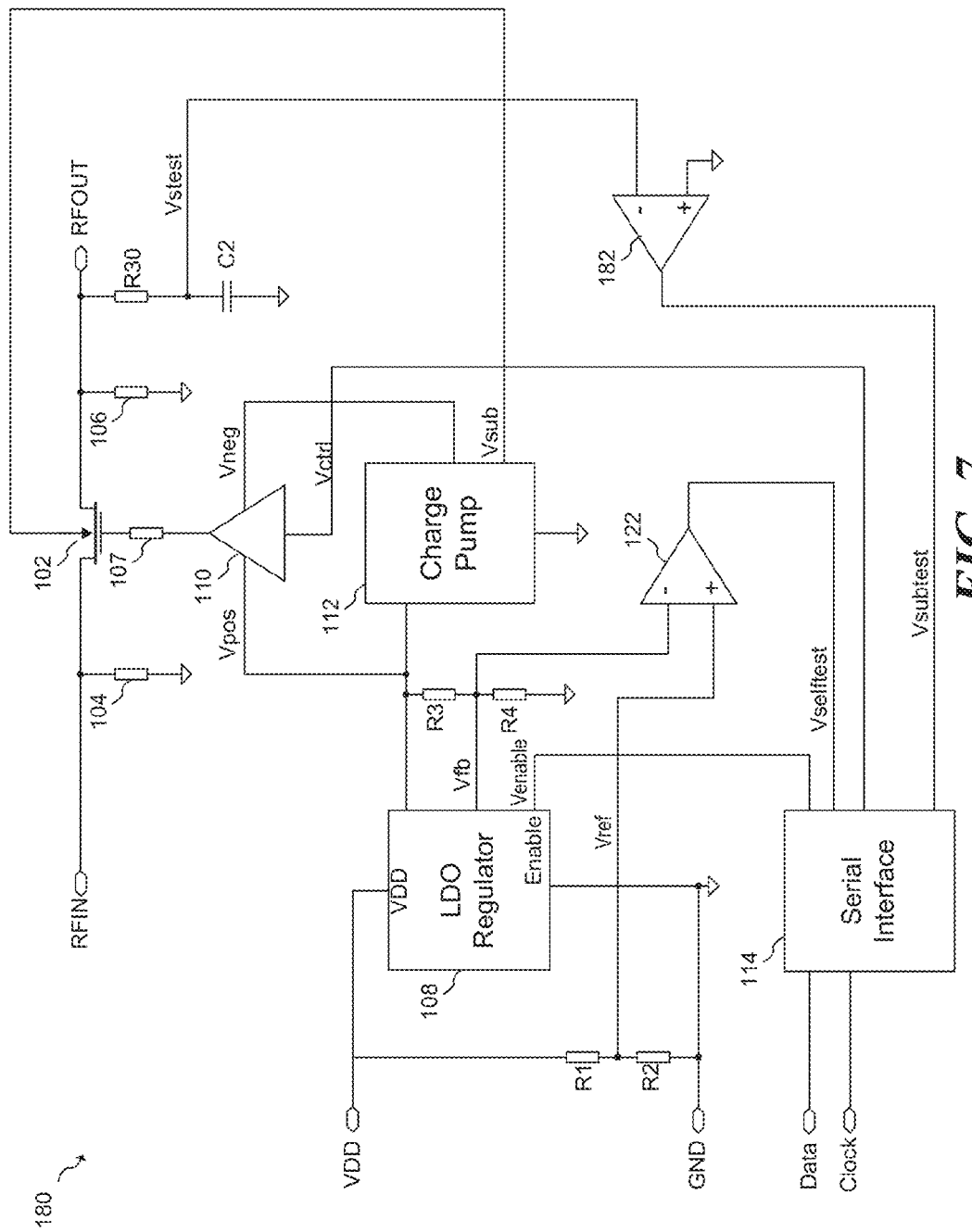
FIG. 7 illustrates an embodiment RF switch configured to perform a substrate leakage detection measurement.

Another way in which a device failure of switching transistor 102 may be detected is by monitoring the gate voltage or the source voltage of switching transistor 102 under DC conditions while a negative voltage is applied to the substrate of switching transistor 102. Negative voltage Vsub generated by charge pump 112 thereby pulls the source and/or the drain of transistor 102 to a negative voltage in the case of some device failures. In the embodiment of FIG. 7, IC 180 includes comparator 182 that compares a voltage at RFOUT with ground potential.

In one embodiment, the voltage at RFOUT is coupled to the input of comparator 182 via R30 and C2. These components provide a low pass filtered version of RFOUT as well as provide ESD protection at the input of comparator 182. Alternatively, voltage Vstest may be compared with a slightly negative voltage, for example, a voltage of about −0.5 V, or voltage Vstest may be compared to a variable voltage generated by a voltage divider coupled between VDD and a generated negative voltage, such as Veg and Vsub. Alternatively, other threshold voltages besides −0.5 V may be used. In an embodiment, switching transistor 102 is considered to be damaged if voltage Vstest is determined to be less than the threshold voltage of comparator 182. The state of comparator 182 may be monitored via a serial interface 114.

In embodiments employing multiple switching transistors, leakage tests may be separately performed on each RF switching transistor, and the result of each test interpreted by internal go-no-go logic. In such an embodiment, the source and/or drain of each switch may be multiplexed to comparator 182. Alternatively, multiple test comparators may be used.

It should be understood that the embodiments shown in FIGS. 2, 4, 5, 6 and 7 are not mutually exclusive and may be combined together in various combinations. For example, one embodiment device may include test circuitry configured to perform embodiment testing of the output of LDO regulator 108, the output current of LDO regulator 108, the output voltages generated by charge pump 112, the substrate voltage of switching transistor 102, as well as performing an embodiment device leakage test by monitoring the source and/or drain of switching transistor 102.

Figure 8:
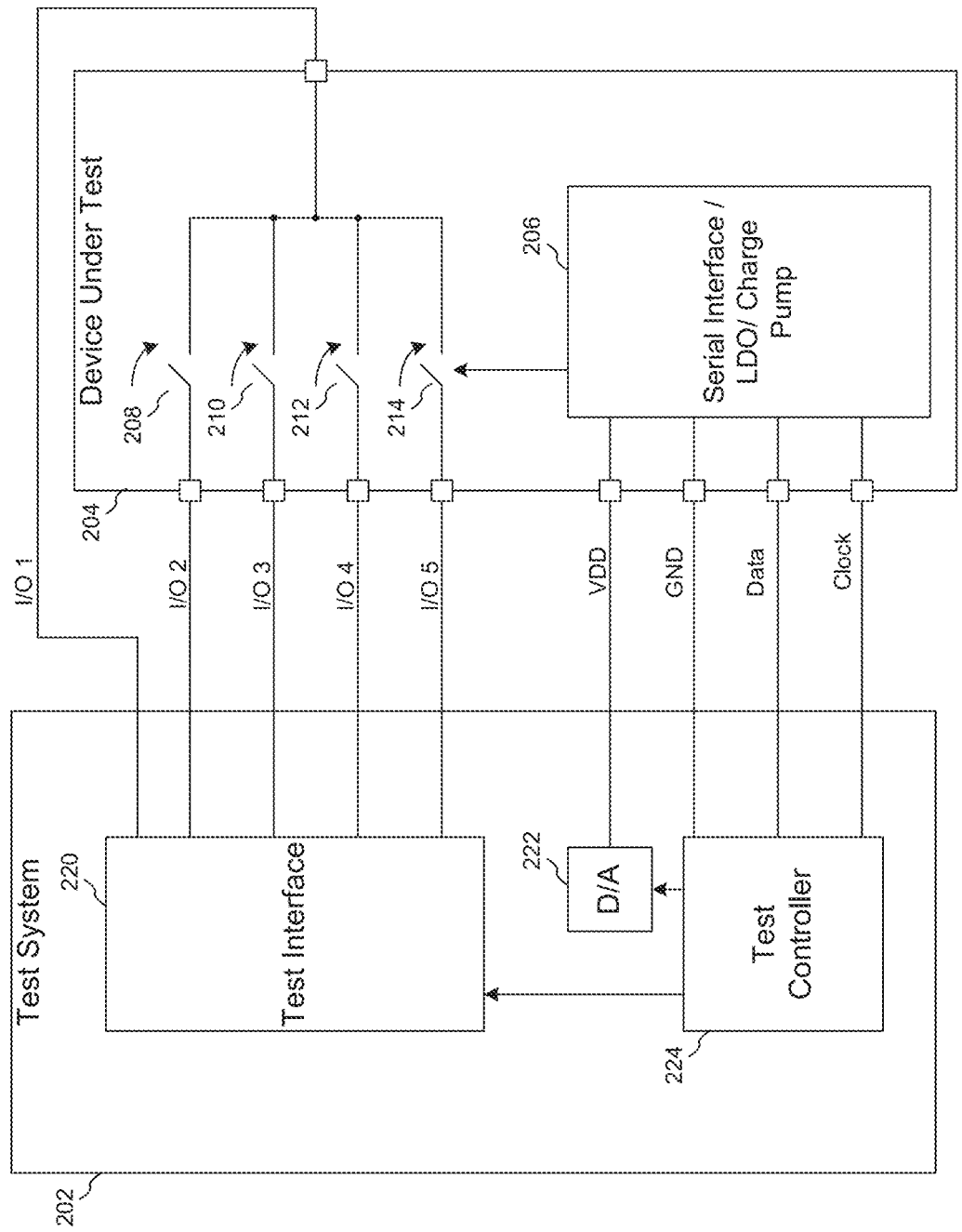
FIG. 8 illustrates an embodiment test system coupled to an embodiment device under test.

FIG. 8 illustrates test system 202 coupled to device under test 204. In an embodiment, device under test 204 may be an embodiment antenna switch integrated circuit having MOS switches 208, 210, 212 and 214 that couple input signals IO2, IO3, IO4 and IO5 to common output signal IO1. Serial interface/LDO regulator/charge pump circuit controls switches 208, 210, 212 and 214, and contain embodiment test circuitry described in embodiments herein. Test system 202 has test interface circuit 220, digital to analog converter (D/A) 222 and test controller 224. In an embodiment, test controller 224 provides test data and test clock signals to block 206 in device under test 204, as well as providing control signals to test interface 220 and D/A converter 222. During testing, D/A converter 222 may provide supply voltage VDD for device under test 204, and test interface 220 may monitor and/or provide test voltages to signals IO1, IO2, IO3, IO4 and IO5 coupled to device under test 204.

In some embodiments, test system 202 may reside in a wafer tester, an integrated circuit tester, or other test system used to measure the performance of device under test 204. Alternatively, test system 202 may reside on a board level tester and/or reside in a target system in order to provide functional test or diagnostic support of device under test 204.

In accordance with an embodiment, a method of testing an integrated circuit includes receiving a supply voltage on the integrated circuit via a first input pin, providing power to circuits disposed on the integrated circuit via the first input pin, comparing the supply voltage to an internally generated voltage, generating a digital output value based on the comparing, and applying the digital output value to a pin of the integrated circuit. In some embodiments, providing power to circuits may include providing power to a main power supply or providing power to a logic power supply.

In some embodiments, comparing the supply voltage to the internally generated voltage is performed by a comparator or an analog-to digital converter. Moreover, comparing the supply voltage to an internally generated voltage may be performed by dividing the supply voltage using a resistive voltage divider, or by comparing the supply voltage to a node of an internal voltage regulator. In an embodiment, the node of the internal voltage regulator may be a feedback voltage of the internal voltage regulator.

In an embodiment, comparing the supply voltage to an internally generated voltage includes comparing the supply voltage to an output voltage of a charge pump, and comparing the supply voltage to the output voltage of the charge pump may include comparing a divided supply voltage with a divided charge pump output voltage.

In some embodiments, the method further includes producing the internally generated voltage based on an internal current. The internally generated voltage may be produced by converting a current between an output of an internal regulator circuit and a load of the internal regulator circuit into the internally generated voltage. In some embodiments, the load of the internal regulator circuit may be a charge pump.

In accordance with a further embodiment, a method of testing a MOS switch includes pumping a substrate of the MOS switch to a negative voltage, comparing an output node of a MOS switch to a reference voltage, and determining a failed test condition when the output node of the MOS switch is less than the reference voltage. In an embodiment, the substrate of the MOS switch may include a well disposed in a semiconductor substrate.

In accordance with another embodiment, an integrated circuit includes a first circuit, a digital interface, a data converter having a first input coupled to a supply voltage, a second input coupled to the first circuit, and an output coupled to the digital interface, wherein digital interface is readable in a test mode. The data converter may include a comparator and/or the digital interface may include a serial interface.

In some embodiments, the first circuit includes a voltage regulator, the first input of the data converter is coupled to the supply voltage via a voltage divider, and the second input of the data converter is coupled to a feedback voltage of the regulator. The digital interface may be configured to indicate an output state of the data converter in the test mode.

In an embodiment, the first circuit includes a voltage regulator, the first input of the data converter is coupled to the supply voltage via a voltage divider, the integrated circuit further comprises a current measuring circuit coupled in series with an output of the voltage regulator, and the second input of the data converter is coupled to an output of the current measuring circuit. In some embodiments, the current measuring circuit includes a differential amplifier having inputs coupled to a current measuring resistor.

In an embodiment, the first circuit includes a charge pump, the first input of the data converter is coupled to the supply voltage via a first voltage divider, and the second input of the data converter is coupled to an output of the charge pump. The second input of the data converter may be coupled to the output of the charge pump via a second voltage divider coupled between the supply voltage and the output of the charge pump.

In an embodiment, the first circuit includes a charge pump, the first input of the data converter is coupled to the supply voltage via a first voltage divider, the integrated circuit further comprises a current measuring circuit coupled in series with an output of the charge pump and a substrate connection of a semiconductor switch, and the second input of the data converter is coupled to an output of the current measuring circuit.

In accordance with a further embodiment, an integrated circuit includes a semiconductor switch, a digital interface, a comparator having a first input coupled to a reference voltage, a second input coupled to a substrate connection of the semiconductor switch, and an output coupled to the digital interface. The reference voltage may be less than or equal to a ground voltage. In an embodiment, the digital interface is configured to indicate whether a first fault condition exists based on whether the comparator indicates that a voltage of the substrate connection is greater than the reference voltage. The first fault condition may include a substrate leakage condition.

In accordance with a further embodiment, and integrated switch system includes a voltage regulator, a digital interface, a power supply input, a charge pump, an RF switch, and a measurement interface circuit. The measurement interface circuit may include a comparator having a first input coupled to the power supply input, a second input coupled to a parameter measurement node, and an output coupled to the digital interface. The digital interface comprises a serial interface, and the RF switch may include a plurality of RF switches.

In an embodiment, the first input of the comparator is coupled to the power supply input via a voltage divider, and the second input of the comparator is coupled to a feedback node of the voltage regulator. In some embodiments, the first input of the comparator is coupled to the power supply input via a voltage divider, and the measurement interface circuit further includes a current measurement circuit coupled in series with an output of the voltage regulator. The second input of the comparator may be coupled to the current measurement circuit.

In an embodiment, the current measurement circuit includes a resistor coupled in series with an output of the voltage regulator, and an amplifier having a positive input coupled to a first terminal of the resistor, a negative input coupled to a second terminal of the resistor and an output coupled to the second input of the comparator.

In an embodiment, the first input of the comparator is coupled to the power supply input via a voltage divider, and the measurement interface circuit further includes a current measurement circuit coupled in series with an output of the charge pump and a substrate connection of the RF switch.

In some embodiments, the first input of the comparator is coupled to the power supply input via a first voltage divider, and the second input of the comparator is coupled to a second voltage divider coupled between an output of the charge pump of the power supply input.

Advantages of some embodiments include the ability to monitor internal voltages and currents of an integrated circuit during device level production test and during a board level application test by using an external supply voltage as a reference without having to use dedicated test pins. Some embodiments advantageously allow the detection of small deviations of internally generated reference references and/or leakage currents from specified ranges that may later cause field failures and/or performance degradation. In some situations, these internally generated reference references and/or leakage currents may not be otherwise directly or indirectly accessible for measurement.

Advantages of embodiments that relay on resistor, diode and/or CMOS voltage dividers instead of on on-chip generated voltages includes increased reliability, lower power consumption and decreased test time, since the additional test-support reference voltage generators need not be tested.

In some embodiments, a time consuming RF test of RF switching is unnecessary, thereby advantageously reducing test time and test costs. A further advantage includes the ability to detect damage to RF switching transistors using a DC test.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing an integrated circuit, the method comprising:
   receiving a supply voltage on the integrated circuit via a first input pin;
   providing power to circuits disposed on the integrated circuit via the first input pin;
   comparing, by a data converter of the integrated circuit, the supply voltage to a voltage internally generated by a first circuit of the integrated circuit;
   providing, by the data converter, a first output value in accordance with a voltage difference between the supply voltage and the internally generated voltage;
   generating, by a digital interface of the integrated circuit, a digital output value based on the first output value; and
   applying the digital output value to a pin of the integrated circuit such that the digital output value is readable in a test mode.

2. The method of claim 1, wherein comparing the supply voltage to the internally generated voltage comprises using a comparator.

3. The method of claim 1, wherein comparing the supply voltage to the internally generated voltage comprises using an analog-to digital converter.

4. The method of claim 1, wherein comparing the supply voltage to an internally generated voltage comprises dividing the supply voltage using a resistive voltage divider.

5. The method of claim 1, wherein applying the digital output value to the pin of the integrated circuit comprises transmitting the digital output value via a serial data interface.

6. The method of claim 1, wherein comparing the supply voltage to an internally generated voltage comprises comparing the supply voltage to a node of an internal voltage regulator.

7. The method of claim 6, wherein the node of the internal voltage regulator is a feedback voltage of the internal voltage regulator.

8. The method of claim 1, wherein comparing the supply voltage to an internally generated voltage comprises comparing the supply voltage to an output voltage of a charge pump.

9. The method of claim 8, wherein comparing the supply voltage to the output voltage of the charge pump comprises comparing a divided supply voltage with a divided charge pump output voltage.

10. The method of claim 1, further comprising producing the internally generated voltage based on an internal current.

11. The method of claim 10, wherein producing the internally generated voltage based on the internal current comprises converting a current between an output of an internal regulator circuit and a load of the internal regulator circuit into the internally generated voltage.

12. The method of claim 11, wherein the load of the internal regulator circuit comprises a charge pump.

13. An integrated circuit comprising:
   a first circuit;
   a digital interface; and
   a data converter having a first input coupled to a supply voltage, a second input coupled to the first circuit, and a first output coupled to the digital interface, wherein the digital interface is readable in a test mode, and the data converter is configured to provide a value at the first output based on a voltage difference between the first input and the second input.

14. The integrated circuit of claim 13, wherein the data converter comprises a comparator.

15. The integrated circuit of claim 13, wherein the digital interface comprises a serial interface.

16. The integrated circuit of claim 13, wherein:
   the first circuit comprises a voltage regulator;
   the first input of the data converter is coupled to the supply voltage via a voltage divider; and
   the second input of the data converter is coupled to a feedback voltage of the regulator.

17. The integrated circuit of claim 16, wherein the digital interface is configured to indicate an output state of the data converter in the test mode.

18. The integrated circuit of claim 13, wherein:
   the first circuit comprises a voltage regulator;
   the first input of the data converter is coupled to the supply voltage via a voltage divider;
   the integrated circuit further comprises a current measuring circuit coupled in series with an output of the voltage regulator; and
   the second input of the data converter is coupled to an output of the current measuring circuit.

19. The integrated circuit of claim 18, wherein the current measuring circuit comprises a differential amplifier having inputs coupled to a current measuring resistor.

20. The integrated circuit of claim 13, wherein:
   the first circuit comprises a charge pump;
   the first input of the data converter is coupled to the supply voltage via a first voltage divider; and
   the second input of the data converter is coupled to an output of the charge pump.

21. The integrated circuit of claim 20, wherein the second input of the data converter is coupled to the output of the charge pump via a second voltage divider coupled between the supply voltage and the output of the charge pump.

22. The integrated circuit of claim 13, wherein:
   the first circuit comprises a charge pump;
   the first input of the data converter is coupled to the supply voltage via a first voltage divider;
   the integrated circuit further comprises a current measuring circuit coupled in series with an output of the charge pump and a substrate connection of a semiconductor switch; and
   the second input of the data converter is coupled to an output of the current measuring circuit.

23. An integrated circuit comprising:
   a semiconductor switch;
   a digital interface; and
   a comparator having a first input coupled to a reference voltage, a second input coupled to a substrate connection of the semiconductor switch, and an output coupled to the digital interface, wherein the comparator is configured to provide a value at its output based on a voltage difference between the first input and the second input.

24. The integrated circuit of claim 23, wherein the reference voltage is less than or equal to a ground voltage.

25. The integrated circuit of claim 23, wherein the digital interface is configured to indicate whether a first fault condition exists based on whether the comparator indicates that a voltage of the substrate connection is greater than the reference voltage.

26. The integrated circuit of claim 25, wherein the first fault condition comprises a substrate leakage condition.

27. A method of testing an integrated circuit, the method comprising:
receiving a first supply voltage on the integrated circuit via a first input pin;
providing power to circuits disposed on the integrated circuit via the first input pin;
providing, by an internal voltage generation circuit of the integrated circuit, an internal supply voltage at an internal supply voltage terminal;
comparing the first supply voltage to the internal supply voltage using a first analog comparator configured to compare two analog voltages with each other;
generating, by a digital interface, a first digital output value based on the comparing; and
applying the first digital output value to a pin of the integrated circuit such that the first digital output value is readable in a test mode.

28. The method of claim 27, further comprising:
measuring an output current of the internal voltage generation circuit using a current measurement circuit;
comparing an output of the current measurement circuit to the first supply voltage with a second analog comparator;
generating a second digital output value based on the comparing the output of the current measuring circuit; and
applying the first digital output value to a pin of the integrated circuit.

29. The method of claim 27, further comprising
dividing the internal supply voltage using a first voltage divider to form a first divided voltage; and
dividing the first supply voltage using a second voltage divider to form a second divided voltage, wherein comparing the first supply voltage to the internal supply voltage further comprises comparing the first divided voltage with the second divided voltage.

30. The method of claim 27, wherein the internal voltage generation circuit comprises a linear voltage regulator.

31. The method of claim 30, wherein the internal voltage generation circuit comprises a charge pump.

32. An integrated circuit comprising:
a first internal voltage generation circuit configured to produce an internal supply voltage at a first internal supply voltage terminal;
a digital interface; and
a first analog comparator having a first input coupled to a first power supply pin, a second input coupled to the first internal supply voltage terminal, and an output coupled to the digital interface, wherein the digital interface is readable in a test mode.

33. The integrated circuit of claim 32, further comprising:
a first voltage divider having an input coupled to the first power supply pin and an output coupled to the first input of the first analog comparator; and
a second voltage divider having an input coupled to the first internal supply voltage terminal and an output coupled to the second input of the first analog comparator.

34. The integrated circuit of claim 32, wherein the first internal voltage generation circuit is a linear voltage regulator.

35. The integrated circuit of claim 32, wherein the first internal voltage generation circuit is a charge pump.

36. The integrated circuit of claim 32, further comprising:
a current measurement circuit having an input coupled to the first internal supply voltage terminal, the current measurement circuit configured to measure a current supplied by the first internal voltage generation circuit; and
a second analog comparator having a first input coupled to the first power supply pin, a second input coupled an output of the current measurement circuit, and an output coupled to the digital interface.

* * * * *